(12) United States Patent
Ricotti et al.

(10) Patent No.: US 6,778,349 B2
(45) Date of Patent: Aug. 17, 2004

(54) DRIVING CIRCUIT FOR PIEZOELECTRIC ACTUATORS, IN PARTICULAR FOR A READ/WRITE TRANSDUCER FOR HARD DISKS

(75) Inventors: Giulio Ricotti, Broni (IT); Sandro Rossi, Lungavilla (IT); Giovanni Frattini, Torre D'Isola (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 285 days.

(21) Appl. No.: 09/899,832

(22) Filed: Jul. 6, 2001

(65) Prior Publication Data

US 2002/0089777 A1 Jul. 11, 2002

(30) Foreign Application Priority Data

Jul. 7, 2000 (IT) ...................................... TO2000A0687

(51) Int. Cl.[7] .......................... G11B 21/02; G11B 19/02
(52) U.S. Cl. .......................................... 360/75; 360/69
(58) Field of Search .......................... 360/69, 75, 77.02, 360/77.01, 78.01, 78.04, 78.12, 46, 65, 55

(56) References Cited

U.S. PATENT DOCUMENTS

| | | | | |
|---|---|---|---|---|
| 5,606,468 A | * | 2/1997 | Kodama | 360/75 |
| 6,021,015 A | * | 2/2000 | Jeffrey et al. | 360/69 |
| 6,316,988 B1 | * | 11/2001 | Forehand et al. | 327/538 |

* cited by examiner

Primary Examiner—Andrew L. Sniezek
(74) Attorney, Agent, or Firm—Lisa K. Jorgenson; Robert Iannucci; Seed IP Law Group PLLC

(57) ABSTRACT

A driving circuit for piezoelectric actuators comprises a chip of semiconductor material integrating both an interface circuit receiving at input a control signal generated by a control logic unit, and a power circuit driving the piezoelectric actuators. The power circuit is directly connected to the output of the interface circuit.

24 Claims, 4 Drawing Sheets

DRIVING CIRCUIT FOR PIEZOELECTRIC ACTUATORS, IN PARTICULAR FOR A READ/WRITE TRANSDUCER FOR HARD DISKS

BACKGROUND OF THE INVENTION

1. Field of the Invention

The present invention regards a driving circuit for piezoelectric actuators, in particular for a read/write transducer for hard disks.

2. Description of the related art

As is known, piezoelectric actuators are currently used in actuator device for hard disks provided with a dual actuation stage, in which a first actuation stage carries out rough displacement of a read/write transducer for a hard disk during track following, and a second actuation stage, constituted by the piezoelectric actuators, performs finer adjustment of the position of the read/write transducer.

Piezoelectric actuators for displacement of readwrite transducers for hard disks are mainly used for the following reasons:

1. an increasingly higher data-storage capacity is required inside the hard disk (understood as Gbytes per disk) resulting in a continuous increase in the density of data stored per unit area, and hence in a continuously decreasing distance between the tracks. It follows that, in order to have correct reading/writing of the hard disk, it is necessary to position the readwrite transducer with a high degree of precision. Given that piezoelectric actuators are positioned close to the transducer, they are able to control submicrometric displacements, thus ensuring the high precision required; and 2. an increasingly higher speed of access to the data stored on the hard disk is required, which finds its limitation precisely in the actuator device. Given that piezoelectric actuators have to actuate very small masses, they are able to position the read/write transducer in a considerably short time as compared to single-actuation actuator devices.

An example of an actuator device for a hard disk with dual actuation stage is schematically illustrated in FIG. 1. The actuator device 1 for a hard disk comprises an induction motor 2 (also referred to as "voice coil motor") to which a suspension 3 consisting of a lamina is fixed in cantilever fashion. The suspension 3 terminates with a flexible portion 4 which carries, at its free end, a read/write transducer 5 (referred to as "slider"), set, in the operating condition, facing a surface of a hard disk 6, and a pair of actuators 7a and 7b of piezoelectric material, each set on one side of the free end of the flexible portion 4. In particular, each piezoelectric actuator 7a, 7b consists of a chip of piezoelectric material enclosed between two metal plates forming the two electrodes of the actuator. One electrode is connected to the flexible portion 4 (ground), whilst the other is floating.

Advantageously, the readwrite transducer 5 is fixed to the flexible portion 4 by means of a joint 8 (referred to as "gimbal"). In addition, the read/write transducer 5 supports a read/write head 9 constituting the read/write device proper.

In the actuator device 1, the first actuation stage consists of the induction motor 2 displacing the ensemble formed by the suspension 3 and the read/write transducer 5 through the hard disk during track search (rough displacement), whereas the second actuation stage 10 comprises the flexible portion 4 and the piezoelectric actuators 7a, 7b, carrying out fine control of the position of the read/write transducer 5, following the track (finer regulation).

In particular, the flexible portion 4 converts the mechanical deformation undergone by the piezoelectric actuators 7a, 7b, following upon application of a potential to their floating electrodes, into a linear displacement of the read/write transducer 5. To a first approximation, apart from hysteresis phenomena due to the non-unique relation between the potential applied to the floating electrodes of the piezoelectric actuators 7a, 7b and the mechanical deformation undergone by the piezoelectric actuators, when positive potentials are applied to the floating electrodes a displacement of the read/write transducer 5 is obtained in a first direction, whilst when negative potentials are applied to the floating electrodes, a displacement of the read/write transducer is obtained in a second direction opposite to the former one.

For this purpose, the piezoelectric actuators 7a, 7b are driven by power-amplifier circuits having output dynamics both positive and negative with respect to the ground of the actuator. Typically, power-amplifier circuits are used having output dynamics of several tens of volts (for example, from ±12 V to over ±40 V).

The power-amplifier circuits are controlled by a control logic unit able to perform all the control algorithms required for displacing the readwrite transducer on all the tracks of the hard disk according to the data-reading requirements.

Since these algorithms are altogether in numerical form (i.e., they are numerical processings that are performed by calculating machines, such as microprocessors operating on numbers in binary form electronically represented by digital signals), whereas the control signals to be supplied to the power amplifiers are of an analog type (typically a voltage or an electrical charge), an interface circuit must be provided between the control logic unit and the power-amplifier circuits.

At present, the interface circuit and the power-amplifier circuits are formed in two distinct chips of semiconductor material. This involves a reduced reliability and poor immunity to external disturbance, in that the interconnections between the interface circuit and the power-amplifier circuits are made on the printed circuit to which the two chips are welded, and are thus affected by the noise produced by the other power circuits present on the printed circuit itself (for example, circuits for driving the induction motor and the motor for rotating the hard disk). In addition, there is also a reduction in the speed for controlling the piezoelectric actuators due to the delays that the control signals, supplied by the control logic unit, undergo along the path that takes them to the power-amplifier circuits. Furthermore, the presence of two distinct chips results in a non-indifferent increase in the area of printed circuit required.

SUMMARY OF THE INVENTION

An embodiment of the present invention provides a driving circuit for piezoelectric actuators, in particular for a readwrite transducer for hard disks, that will overcome the limitations pointed out with reference to the prior art. The driving circuit is integrated in a chip of semiconductor material and includes an interface circuit having an input that receives at least one control signal generated by a control logic unit; and a power circuit that drives the piezoelectric actuators and has an input directly connected to said interface circuit.

BRIEF DESCRIPTION OF THE DRAWINGS

The characteristics and advantages of the driving circuit according to the invention will emerge from the ensuing description of an example of embodiment, which is given purely to provide a non-limiting illustration, with reference to the attached drawings, in which.

DETAILED DESCRIPTION OF THE INVENTION

Figure 1:
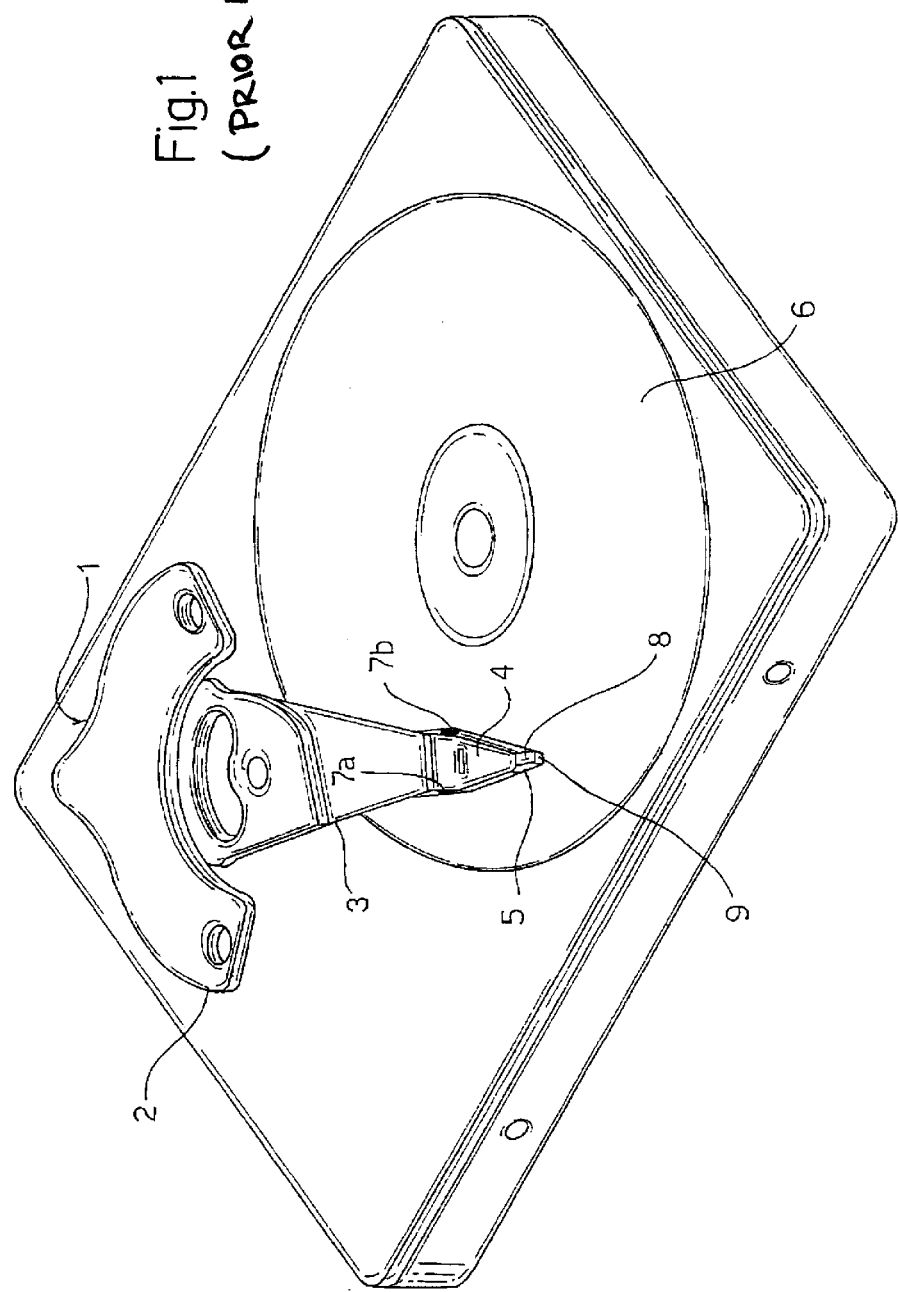
FIG. 1 is a perspective view of an actuator device for a hard disk with dual actuation stage.
Figure 2:
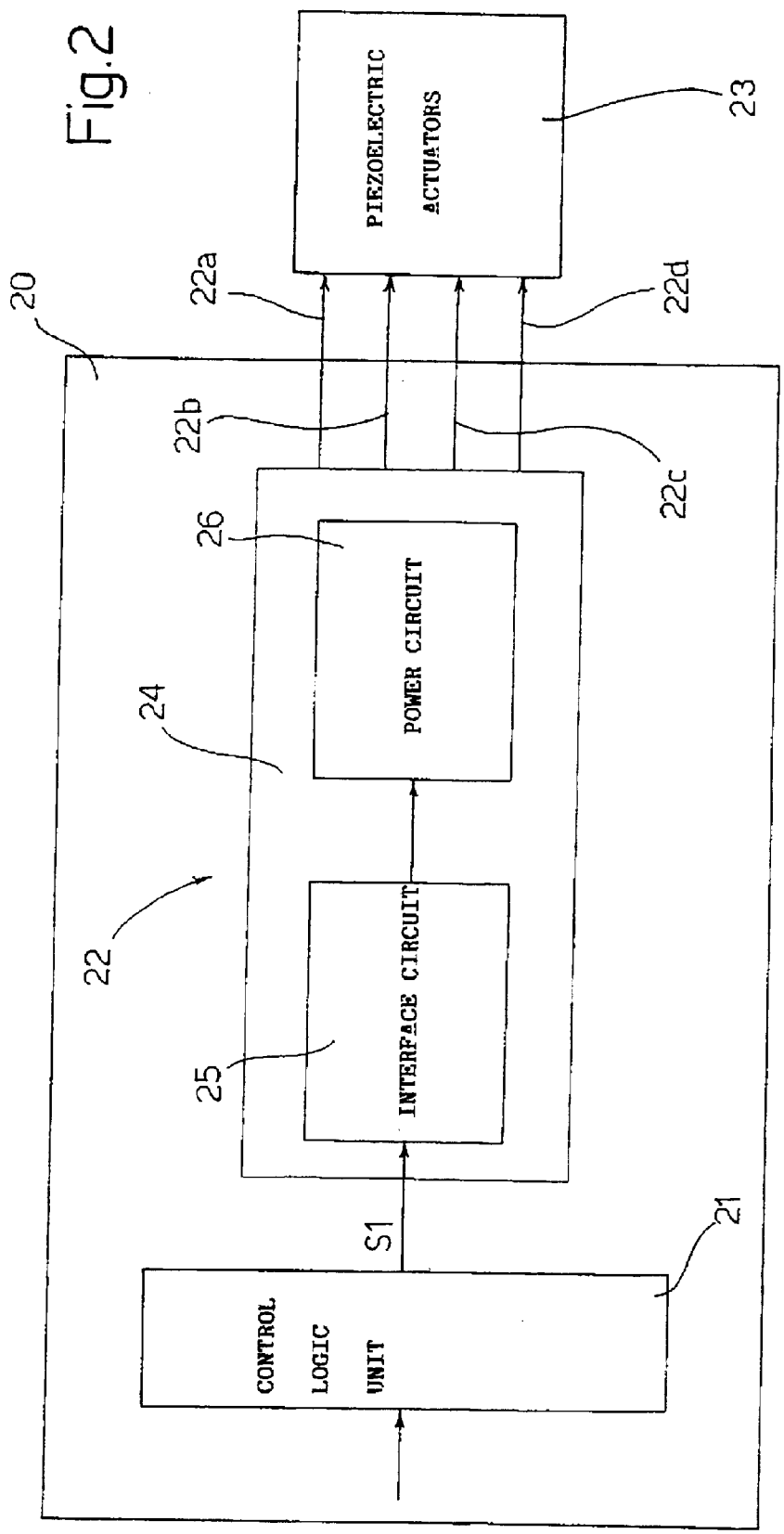
FIG. 2 is a schematic representation of a driving circuit for one of the actuation stages of the actuator device of FIG. 1, according to the invention.

FIG. 2 shows a driving circuit 22 comprising a first output terminal 22a, a second output terminal 22b, a third output terminal 22c, and a fourth output terminal 22d, driving an actuation stage 23 comprising piezoelectric actuators.

The driving circuit 22 is welded on a printed circuit 20 together with a control logic unit 21 (for example, a microprocessor). The driving circuit 22 is controlled by the control logic unit 21 which receives at input an activation signal and generates at output the control signals S1 for controlling the driving circuit.

The driving circuit 22 is integrated in a single chip 24 of semiconductor material comprising an interface circuit 25 and a power circuit 26.

Figure 3:
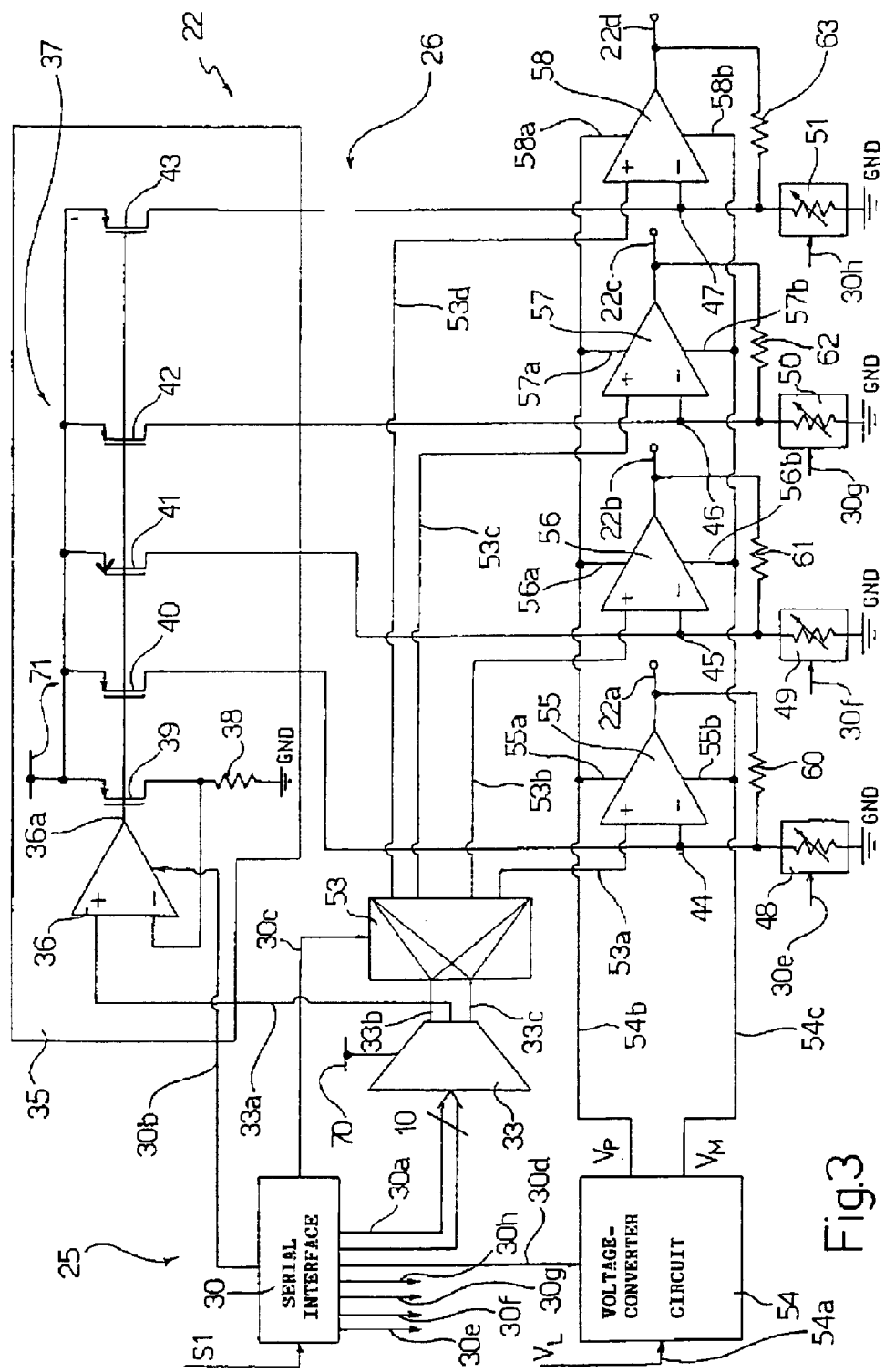
FIG. 3 is a more detailed circuit representation of the driving circuit of FIG. 2.

With reference to FIG. 3, the interface circuit 25 comprises a serial interface 30 having an input terminal for receiving the control signals $S_1$ and eight output terminals 30a, 30b, 30c, 30d, 30e, 30f, 30g, 30h. The first output terminal 30a of the serial interface 30 is connected to an input terminal of a digital-to-analog converter 33 (for example of a 10-bit resistive type with differential output) having a supply terminal connected to a first supply line 70, and a first output terminal 33a, a second output terminal 33b, and a third output terminal 33c.

The interface circuit 25 also comprises a level shifter 35 including an input stage 36 and an output stage 37 cascade connected to one another. In greater detail, the input stage 36 is implemented by means of an operational amplifier having an enabling terminal connected to the second output terminal 30b of the input serial interface 30; a non-inverting terminal connected to the first output terminal 33a of the digital-to-analog converter 33; an inverting terminal connected to a first terminal of a resistor 38, having a second terminal connected to a reference potential GND (for example, ground); and an output terminal 36a The output stage 37 comprises a current-mirror including a first output transistor 39, a second output transistor 40, a third output transistor 41, a fourth output transistor 42, and a fifth output transistor 43, which are all of the PMOS type and have respective control terminals connected to the output terminal 36a, respective first conduction terminals connected to a second supply line 71, and respective second conduction terminals. In particular, the second conduction terminal of the first output transistor 39 is connected to the first terminal of the resistor 38.

The interface circuit 25 moreover includes a multiplexer 53 having a control terminal connected to the third output terminal 30c of the serial interface 30, a first input terminal and a second input terminal respectively connected to the second output terminal 33b and to the third output terminal 33c of the digital-to-analog converter 33, and a first output terminal 53a, a second output terminal 53b, a third output terminal 53c, and a fourth output terminal 53d.

The power circuit 26 comprises a voltage converter 54 and a first programmable-gain power amplifier 55, a second programmable-gain power amplifier 56, a third programmable-gain power amplifier 57, and a fourth programmable-gain power amplifier 58. In detail, the voltage converter 54 has a control terminal connected to the fourth output terminal 30d of the serial interface 30, an input terminal 54a to which an input voltage $V_L$ (for example 5 V) is applied, and a first output terminal 54b and a second output terminal 54c for generating, respectively, a first output voltage $V_P$ and a second output voltage $V_M$ which are higher than the input voltage $V_L$ and symmetrical with respect to the reference potential GND (for example±21 V). Alternatively, the voltage converter 54 may generate only the positive output voltage $V_P$. In this case, the terminal 54c is connected to the reference potential GND.

The first, second, third, and fourth power amplifiers 55, 56, 57, 58 have respective first supply terminals 55a, 56a, 57a, 58a connected to the first output terminal 54b of the voltage converter 54, respective second supply terminals 55b, 56b, 57b, 58b connected to the second output terminal 54c of the voltage converter 54, and respective output terminals connected to an output terminal of the driving circuit 22. In detail, the first power amplifier 55 has a non-inverting terminal connected to the first output terminal 53a of the multiplexer 53, and an inverting terminal connected to the second conduction terminal of the second output transistor 40. The inverting terminal of the first power amplifier 55 is also connected to the reference potential GND via a first programmable resistor 48, and to the first output terminal 22a of the driving circuit 22 via a first resistive element 60.

Likewise, the second power amplifier 56 has a non-inverting terminal connected to the second output terminal 53b of the multiplexer 53, and an inverting terminal connected to the second conduction terminal of the third output transistor 41. The inverting terminal of the second power amplifier 56 is also connected to the reference potential GND via a second programmable resistor 49, and to the second output terminal 22b of the driving circuit 22 via a second resistive element 61.

The third power amplifier 57 has a non-inverting terminal connected to the third output terminal 53c of the multiplexer 53, and an inverting terminal connected to the second conduction terminal of the fourth output transistor 42. The inverting terminal of the third power amplifier 57 is also connected to the reference potential GND via a third programmable resistor 50, and to the third output terminal 22c of the driving circuit 22 via a second resistive element 62.

The fourth power amplifier 58 has a non-inverting terminal connected to the fourth output terminal 53d of the multiplexer 53, and an inverting terminal connected to the second conduction terminal of the fifth output transistor 43. The inverting terminal of the fourth power amplifier 58 is also connected to the reference potential GND via a fourth programmable resistor 51, and to the fourth output terminal 22d of the driving circuit 22 via a fourth resistive element 63.

In addition, the first programmable resistor 48 has a control terminal connected to the fifth output terminal 30e of the serial interface 30, whilst the second programmable resistor 49 has a control terminal connected to the sixth output terminal 30f of the serial interface 30. Likewise, the third programmable resistor 50 has a control terminal connected to the seventh output terminal 30g of the serial interface 30, whilst the fourth programmable resistor 51 has a control terminal connected to the eighth output terminal 30h of the serial interface 30.

Operation of the driving circuit 22 is described in what follows.

Figure 4:
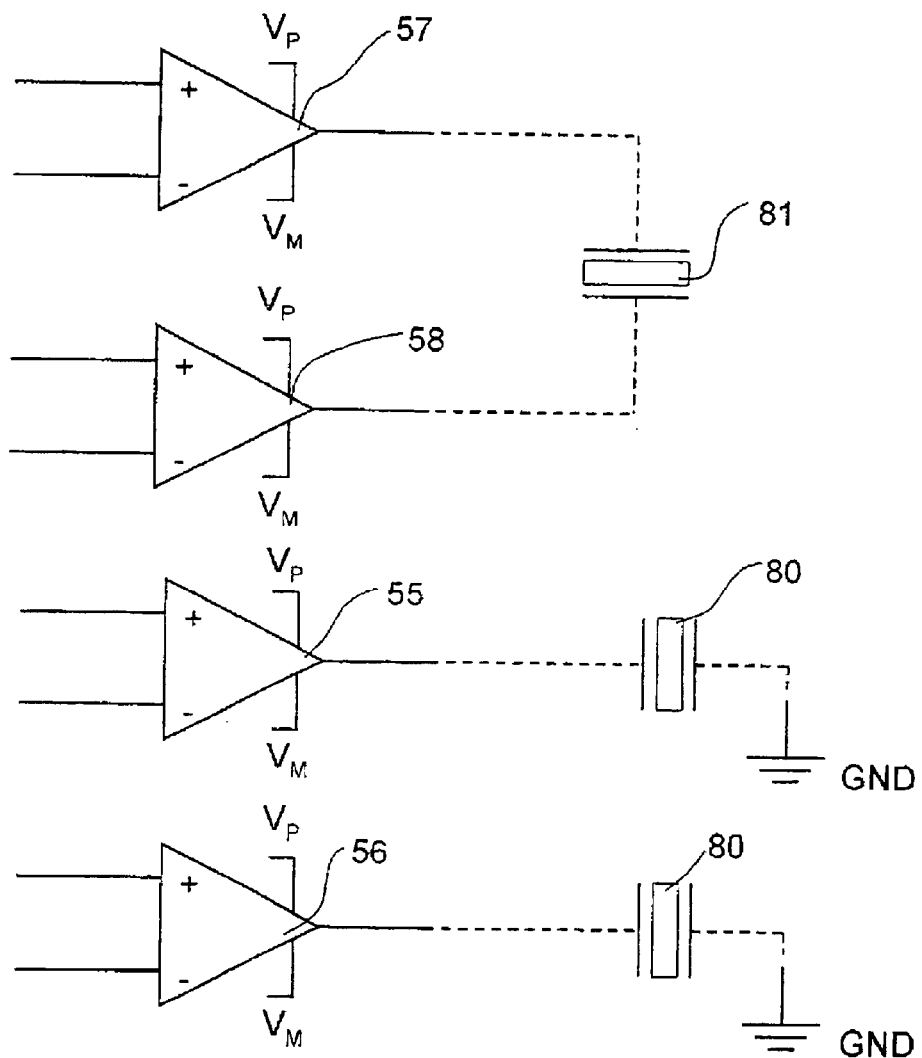
FIG. 4 shows a circuit for connection of the driving circuit of FIG. 3 to one of the actuation stages.

Initially, the serial interface 30 receives at input the control signals $S_1$ and generates at output corresponding configuration words, which are correlated with the amplitude of the analog voltage signals to be applied to the piezoelectric actuator, and corresponding control words, both the configuration words and the control words being 10-bit words. The configuration words are sent to the digit-to-analog converter 33 converting them into analog voltage signals. In particular, the digital-to-analog converter 33 converts each configuration word into two analog voltage signals having a maximum amplitude of 3 V and an opposite polarity with respect to 1.5 V (for instance, 0.5 V and 2.5 V, or else 1.4 V and 1.6 V). The multiplexer 53 receives at input the above-mentioned analog voltage signals and transfers them at output only to the power amplifiers 55, 56, 57, 58 that are selected according to the control word generated by the serial interface 30. In practice, the multiplexer 53 comprises switches which are opened or closed to connect the digital-to-analog converter 33 only to the power amplifiers 55, 56, 57, 58 selected by the serial interface 30. In particular, the serial interface 30 may enable all the power amplifiers 55, 56, 57, 58, or else just two of them, leaving the remaining two off. In both cases, each piezoelectric actuator can be driven either by a single power amplifier (as is shown in FIG. 4 for the power amplifiers 55 and 56, in which two piezoelectric actuators 80 have a first terminal connected to the output of the respective power amplifier 55, 56, and a second terminal connected to ground), or by two power amplifiers (as is shown in FIG. 4 for the power amplifiers 57, 58, in which a piezoelectric actuator 81 has a first terminal connected to the output of a first power amplifier, namely, the power amplifier 57, and a second terminal connected to the output of a second power amplifier, namely the power amplifier 58, this configuration being referred to as a "bridge configuration"). The power amplifiers that are off have each its own output stage configured in tri-state mode (via enabling signals supplied by the multiplexer 53) and its own output terminal connected to the reference potential GND via the respective resistive element 60-63 and the respective programmable resistor 48–51.

The control words have also the function of enabling the level shifter 35 when the power amplifiers 55–58 are supplied in dual mode. In addition, the control words set the values of the first output voltage $V_P$ and of the second output voltage $V_M$ of the voltage converter 54, and set the gain of the power amplifiers 55, 56, 57, 58 (by programming the resistance values associated to the programmable resistors 48, 49, 50, 51) according to the first output voltage $V_P$ and the second output voltage $V_M$.

In particular, the level shifter 35 receives at input the analog voltage signals generated by the digital-to-analog converter 33 and, when enabled, generates at output four current signals, each current signal having an amplitude proportional to half the output dynamics of the digital-to-analog converter 33 (namely, 1.5 V).

The four current signals are then transformed, by the programmable resistors 48–51 and by the resistive elements 60–63, into four voltage signals having an amplitude of 1.5 V. Each voltage signal is applied to the inverting terminal of a respective power amplifier 55, 56, 57, 58, and then subtracted from the analog voltage signal present on the non-inverting terminal of the same power amplifier. In this way, a difference signal is obtained that is amplified and symmetrical with respect to the reference potential GND (for instance, with ±1.5 V dynamics), and hence a signal that is suitable for driving the piezoelectric actuators, when the same power amplifiers are supplied in dual mode.

The advantages that may be obtained with the driving circuit described herein are specified in what follows. In the first place, the driving circuit 22 is able to handle high voltages for driving capacitive loads of from 0.8 nF up to 16 nF (such as piezoceramic actuators). In addition, it is possible to integrate the driving circuit 22 on a single chip 24, instead of on two distinct chips. Consequently, the driving circuit 22 presents reduced dimensions and lower fabrication costs.

The driving circuit 22 moreover enables area to be saved in the printed circuit 20.

In addition, since the driving circuit 22 implements a direct path between the control logic unit 21 and the power amplifiers 55, 56, 57, 58, it minimizes the delays in propagation of the control signals of the latter, thus enabling high driving speeds of the piezoelectric actuators to be achieved.

The driving circuit 22 also presents high reliability and immunity to external disturbance, in so far as the interconnections between the interface circuit 25 and the power circuit 26 are provided inside the chip 24, and not on the printed circuit 20. In this way, the signals travelling in the printed circuit 20, outside the chip 24, are solely of a digital type and are thus immune from disturbance caused by the other power circuits welded on the printed circuit 20.

Finally, it is clear that numerous variations and modifications may be made to the driving circuit described and illustrated herein, all falling within the scope of the inventive idea as defined in the attached claims.

We claim:

1. A driving circuit for piezoelectric actuators, in particular for a read/write transducer for hard disks, the driving circuit being integrated in a chip of semiconductor material, comprising:
   an interface circuit having an input that receives a control signal generated by a control logic unit; and
   a power circuit driving said piezoelectric actuators, said power circuit having an input directly connected to said interface circuit, wherein said power circuit comprises at least two variable-gain power-amplifier circuits integrated in said chip and connected to said piezoelectric actuators, said power-amplifier circuits driving said piezoelectric actuators to control a displacement of said read/write transducer.

2. The circuit according to claim 1, wherein said power-amplifier circuits are connected respectively to the piezoelectric actuators.

3. The circuit according to claim 1, wherein said power-amplifier circuits have respective output terminals connected to the same piezoelectric actuator.

4. The circuit according to claim 1, wherein the power circuit includes a voltage converter with first and second output terminals and each of said power-amplifier circuits is connected between the first output terminal and the second output terminal of the voltage converter, said first and second output terminals being set, respectively, at a first potential and at a second potential.

5. The circuit according to claim 4, wherein said interface circuit comprises:
   interfacing means receiving at input said control signal and supplying at output configuration data and control data, said interfacing means setting, by means of said control data, said variable gain of said power amplifiers, said first potential, and said second potential;

converter means receiving at input said configuration data and supplying at output analog voltage signals, said converter means having pre-set output dynamics; and selector means receiving at input said control data and said analog voltage signals, said selector means selecting, according to said control data, said power amplifiers and transferring said analog voltage signals to a first terminal of said selected power amplifiers.

6. The circuit according to claim 5, wherein said selector means comprise a multiplexer.

7. The circuit according to claim 5, wherein said interface circuit comprises level-shifter means receiving at input said control data and said analog voltage signals, and supplying a plurality of output signals each having an amplitude proportional to one half of said output dynamics of said converter means.

8. The circuit according to claim 7, wherein said output signals are supplied to a second terminal of said power-amplifier means.

9. The circuit according to claim 7, wherein said level-shifter means comprise:
an input stage including an operational amplifier; and
an output stage cascaded connected to said input stage, said output stage including a current-mirror circuit having output terminals connected to respective second terminals of said power amplifiers.

10. A circuit for driving an actuator, comprising:
a control logic unit having an input that receives an activation signal and an output that produces a control signal; and
a driving circuit integrated in a chip of semiconductor material, the driving circuit including:
an interface circuit having an input and an output, the input of the interface circuit being coupled to the output of the control logic unit to receive the control signal generated by the control logic unit; and
a power circuit having an input connected to the output of the interface circuit and an output coupled to drive the actuator, wherein the power circuit comprises first and second variable-gain power-amplifier circuits connected respectively to first and second terminals of the actuator.

11. A circuit for driving an actuator, comprising:
a control logic unit having an input that receives an activation signal and an output that produces a control signal; and
a driving circuit integrated in a chip of semiconductor material, the driving circuit including:
an interface circuit having an input and an output, the input of the interface circuit being coupled to the output of the control logic unit to receive the control signal generated by the control logic unit; and
a power circuit having an input connected to the output of the interface circuit and an output coupled to drive the actuator, wherein the actuator is a first actuator of a pair of first and second actuators and the power circuit comprises first and second variable-gain power-amplifier circuits connected respectively to the first and second actuators.

12. A circuit for driving an actuator, comprising:
a control logic unit having an input that receives an activation signal and an output that produces a control signal; and
a driving circuit integrated in a chip of semiconductor material, the driving circuit including:
an interface circuit having an input and an output, the input of the interface circuit being coupled to the output of the control logic unit to receive the control signal generated by the control logic unit; and
a power circuit having an input connected to the output of the interface circuit and an output coupled to drive the actuator, wherein the power circuit includes first and second variable-gain power-amplifier circuits and a voltage converter with first and second output terminals, each of the power-amplifier circuits being connected between the first output terminal and the second output terminal of the voltage converter, the first and second output terminals being set, respectively, at a first potential and at a second potential.

13. A circuit for driving an actuator, comprising:
a control logic unit having an input that receives an activation signal and an output that produces a control signal; and
a driving circuit integrated in a chip of semiconductor material, the driving circuit including:
an interface circuit having an input and an output, the input of the interface circuit being coupled to the output of the control logic unit to receive the control signal generated by the control logic unit; and
a power circuit having an input connected to the output of the interface circuit and an output coupled to drive the actuator, wherein the power circuit comprises first and second variable-gain power amplifiers and the interface circuit comprises:
a digital interface circuit having an input coupled to the output of the control logic unit; and an output that supplies configuration data and control data;
a digital/analog converter having an input coupled to the output of the digital interface circuit and an output that supplies an analog voltage signal; and
a selector circuit having a first input coupled to the output of the digital interface circuit, a second input coupled to the output of the digital/analog converter, and an output coupled to the power amplifiers, the selector circuit selecting, according to the control data, one of the power amplifiers and transferring the analog voltage signal to a first terminal of the selected power amplifier.

14. The circuit according to claim 13 wherein the interface circuit comprises a level-shifter circuit that includes:
an input stage including an operational amplifier; and
an output stage cascaded connected to the input stage, the output stage including a current-mirror circuit having output terminals connected to respective second terminals of the power amplifiers.

15. A circuit for driving an actuator, comprising:
a digital/analog converter circuit having an input and first, second, and third outputs, the input receiving a digital control signal;
first and second power amplifiers each having first and second signal inputs and an output, the first signal input of the first power amplifier being connected to the first output of the digital/analog converter circuit and the first signal input of the second power amplifier being connected to the second output of the digital/analog converter circuit;
a level-shifter circuit that includes:
an input stage including an operational amplifier having a first input and an output, the first input being connected to the third output of the digital/analog converter circuit; and an output stage including a current-mirror circuit having an input coupled to the output of the input stage, a first output connected to the second signal input of the first power amplifier, and a second output connected to the second signal input of the second power amplifier.

16. The circuit of claim 15 wherein the first and second power amplifiers each include a first supply input, the circuit further comprising:

a voltage converter circuit having an input that receives a first voltage reference and a first output coupled to the first supply inputs of the first and second power amplifiers.

17. The circuit of claim 16 wherein the first and second power amplifiers each include a second supply input and the voltage converter circuit includes a second output coupled to the second supply inputs of the first and second power amplifiers.

18. The circuit of claim 15, further comprising:

a first feedback resistor connected between the output and second supply input of the first power amplifier;

a second feedback resistor connected between the output and second supply input of the second power amplifier;

a first programmable resistor connected between the second supply input of the first power amplifier and a voltage reference; and a second programmable resistor connected between the second supply input of the second power amplifier and the voltage reference.

19. A circuit for driving an actuator, comprising:

a control logic unit having an input that receives an activation signal and an output that produces a control signal; and a driving circuit integrated in a chip of semiconductor material, the driving circuit including:

an interface circuit having an input and an output, the input of the interface circuit being coupled to the output of the control logic unit to receive the control signal generated by the control logic unit; and a power circuit having an input connected to the output of the interface circuit and an output coupled to drive the actuator, the power circuit include a voltage source that alternately supplies positive and negative voltages, with respect to a voltage reference, at the output to drive the actuator.

20. The circuit according to claim 19 wherein the power circuit comprises first and second variable-gain power-amplifier circuits connected respectively to first and second terminals of the actuator.

21. The circuit according to claim 19 wherein the actuator is a first actuator of a pair of first and second actuators and the power circuit comprises first and second variable-gain power-amplifier circuits connected respectively to the first and second actuators.

22. The circuit according to claim 19 wherein the power circuit includes first and second variable-gain power-amplifier circuits and a voltage converter with first and second output terminals, each of the power-amplifier circuits being connected between the first output terminal and the second output terminal of the voltage converter, the first and second output terminals being set, respectively, at a first potential and at a second potential.

23. The circuit according to claim 19 wherein the power circuit comprises first and second variable-gain power amplifiers and the interface circuit comprises:

a digital interface circuit having an input coupled to the output of the control logic unit; and an output that supplies configuration data and control data;

a digital/analog converter having an input coupled to the output of the digital interface circuit and an output that supplies an analog voltage signal; and a selector circuit having a first input coupled to the output of the digital interface circuit, a second input coupled to the output of the digital/analog converter, and an output coupled to the power amplifiers, the selector circuit selecting, according to the control data, one of the power amplifiers and transferring the analog voltage signal to a first terminal of the selected power amplifier.

24. The circuit according to claim 23 wherein the interface circuit comprises a level-shifter circuit that includes:

an input stage including an operational amplifier; and an output stage cascaded connected to the input stage, the output stage including a current-mirror circuit having output terminals connected to respective second terminals of the power amplifiers.

* * * * *